(12) United States Patent
Guthrie et al.

(10) Patent No.: US 11,002,771 B2
(45) Date of Patent: May 11, 2021

(54) PREDICTIVE SAMPLE QUEUEING FOR TIME-SHARED ADC IN A MULTIPHASE PWM CONTROLLER

(71) Applicant: RENESAS ELECTRONICS AMERICA INC., Milpitas, CA (US)

(72) Inventors: Travis Guthrie, Austin, TX (US); Narendra Kayathi, Austin, TX (US)

(73) Assignee: Renesas Electronics America Inc., Milpitas, CA (US)

( * ) Notice: Subject to any disclaimer, the term of this patent is extended or adjusted under 35 U.S.C. 154(b) by 126 days.

(21) Appl. No.: 16/357,220

(22) Filed: Mar. 18, 2019

(65) Prior Publication Data
US 2019/0293696 A1    Sep. 26, 2019

Related U.S. Application Data

(60) Provisional application No. 62/645,624, filed on Mar. 20, 2018.

(51) Int. Cl.
| | |
|---|---|
| *G01R 19/257* | (2006.01) |
| *H03F 3/217* | (2006.01) |
| *G01R 19/00* | (2006.01) |
| *H03K 7/08* | (2006.01) |
| *G01R 19/25* | (2006.01) |
| *H02M 3/157* | (2006.01) |
| *H03M 1/50* | (2006.01) |

(52) U.S. Cl.
CPC ....... *G01R 19/257* (2013.01); *G01R 19/0023* (2013.01); *G01R 19/0038* (2013.01); *G01R 19/0092* (2013.01); *G01R 19/2506* (2013.01); *H02M 3/157* (2013.01); *H03F 3/2175* (2013.01); *H03K 7/08* (2013.01); *H03M 1/504* (2013.01)

(58) Field of Classification Search
CPC .. H03K 7/08; G01R 19/0023; G01R 19/2506; G01R 19/0038; G01R 19/257; G01R 19/2513; G01R 19/2509; G01R 19/0092; G01R 19/25; H03M 1/504; H03M 1/1225; G05B 19/0428; G05B 2219/2612; H02M 2001/0009; H02M 3/157; H02M 2003/1586; H02M 3/1584; H03F 3/2178; H03F 3/2175
See application file for complete search history.

(56) References Cited

U.S. PATENT DOCUMENTS

| | | | |
|---|---|---|---|
| 7,262,628 B2* | 8/2007 | Southwell | H02M 3/1584 323/266 |
| 7,521,907 B2* | 4/2009 | Cervera | H02M 3/157 323/268 |
| 8,494,180 B2 | 7/2013 | Guthrie et al. | |

(Continued)

*Primary Examiner* — Vinh P Nguyen
(74) *Attorney, Agent, or Firm* — Foley & Lardner LLP

(57) ABSTRACT

In one or more embodiments, an efficient scheme is provided for sampling inductor currents in a digital multiphase PWM controller used for high-bandwidth voltage regulation. Some embodiments use the data from the PWM modulator along with weighted states based on the PWM waveform and past conversions in order to prioritize which current sense input should be sampled for each conversion. In these and other embodiments, a single ADC is used to sample inductor currents from two or more phases in a multiphase PWM controller, thereby providing power and area savings, for example.

15 Claims, 10 Drawing Sheets

(56) References Cited

U.S. PATENT DOCUMENTS

| | | | | |
|---|---|---|---|---|
| 8,619,849 B2* | 12/2013 | Effler | .................. | H02M 3/1584 |
| | | | | 375/238 |
| 9,244,473 B2* | 1/2016 | Young | ....................... | G05F 1/12 |
| 9,379,621 B1* | 6/2016 | Kalyanaranman | .... | H02M 3/157 |
| 9,419,627 B2 | 8/2016 | Guthrie et al. | | |
| 9,667,260 B2 | 5/2017 | Guthrie et al. | | |
| 9,977,057 B2* | 5/2018 | Guthrie | .............. | G01R 19/2506 |

\* cited by examiner

PREDICTIVE SAMPLE QUEUEING FOR TIME-SHARED ADC IN A MULTIPHASE PWM CONTROLLER

CROSS-REFERENCE TO RELATED APPLICATIONS

The present application claims priority to U.S. Provisional Application No. 62/645,624 filed Mar. 20, 2018, the contents of which are incorporated herein by reference in their entirety.

TECHNICAL FIELD

The present embodiments relate generally to power converters and more particularly to prioritizing sample allocation of a time-shared analog-to-digital converter (ADC) among phases in a multiphase PWM controller.

BACKGROUND

Multiphase PWM controllers generally employ a common PWM period among all phases and interleave the PWMs so that the pulses for each phase are equally spaced in time through one PWM period. Voltage regulation performance may be enhanced with high-bandwidth inductor current information. For digital controllers, this may require a high sample rate ADC to convert analog inductor current signals to a digital representation. The expense in area and power of this ADC function is significant and is generally proportional to sample rate. Accordingly, a need exists for a solution to these and other problems.

SUMMARY

In one or more embodiments, an efficient scheme is provided for sampling inductor currents in a digital multiphase PWM controller used for high-bandwidth voltage regulation. Some embodiments use the data from the PWM modulator along with weighted states based on the PWM waveform and past conversions in order to prioritize which current sense input should be sampled for each conversion. In these and other embodiments, a single ADC is used to sample inductor currents from two or more phases in a multiphase PWM controller, thereby providing power and area savings, for example.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments provide an efficient scheme for sampling inductor currents in a digital multiphase PWM controller used for high-bandwidth voltage regulation. Some embodiments use the data from the PWM modulator along with weighted states based on the PWM waveform and past conversions in order to prioritize which current sense input should be sampled for each conversion.

Figure 1:
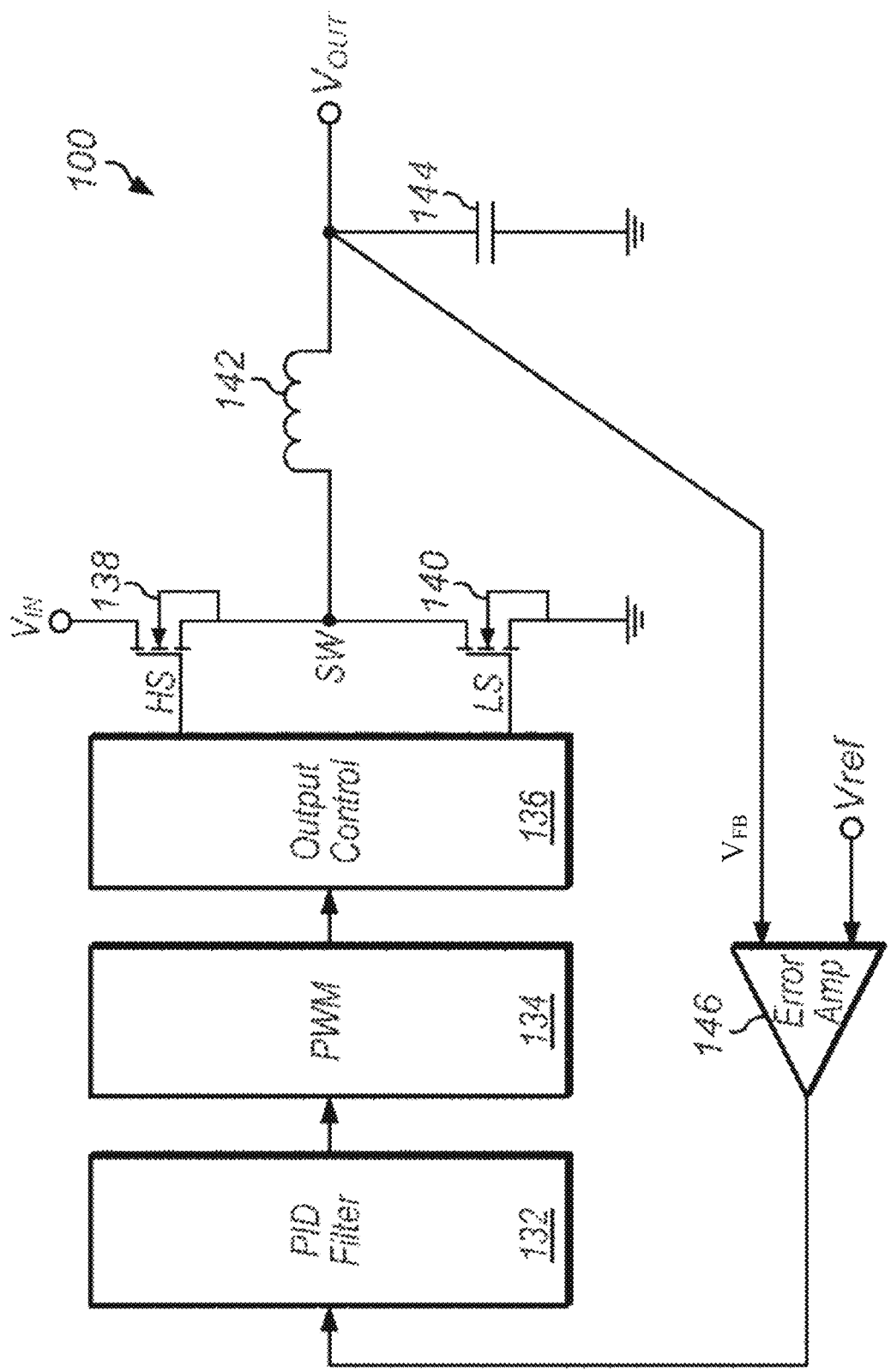
FIG. 1 is an example system block diagram of a controller according to embodiments.

By way of background, DC-to-DC voltage conversion is often performed by switching voltage regulators, or step-down regulators, also referred to as voltage converters, point-of-load regulators, or power converters, converting an input voltage $V_{IN}$ to a regulated output voltage $V_{OUT}$ as required by one or more load devices. More generally, voltage regulators and current regulators are commonly referred to as power converters, and as used herein, the term power converter is meant to encompass all such devices. Switching voltage regulators often use two or more power transistors to convert energy at one voltage to another voltage. One common example of such a voltage regulator 100, commonly called a "Buck Regulator" is shown in FIG. 1. Buck Regulator 100 is a switching regulator (or switching power converter) that typically switches a pair of power transistors (138 and 140) connected between $V_{IN}$ and Ground in order to produce a square-wave at the transistors' common node SW. The produced square-wave can be smoothed out using an LC circuit comprising inductor 142 and capacitor 144 to produce the desired voltage, $V_{OUT}$. A feedback control loop, including an Error Amplifier 146, a Proportional-Integral-Differential (PID) control filter 132, a Pulse-Width-Modulator (PWM) 134, and an Output Control circuit 136 (which includes the drive circuitry to drive high-side and low-side FETs 138 and 140, respectively), can be configured to control the duty-cycle of the output square-wave, and hence the resulting value of $V_{OUT}$ based on the input voltage $V_{IN}$. It should be noted that although the present embodiments will be described in connection with an example application in a buck regulator, this is not limiting. Rather, the present embodiments can also be practiced in other types of regulators such as buck-boost and boost regulators.

Voltage regulators such as regulator 100 are sometimes included in a current share configuration in which power is distributed through shared voltage supplies. Distributed power through shared point of load supplies has a number of compelling advantages over a single point of load supply, or regulator. Distributed power or current sharing may be used to accommodate the ever increasing current demands associated with low voltage applications through better efficiency over a wide range of output currents, reliability through redundancy, and distributed heat dissipation.

Figure 2:
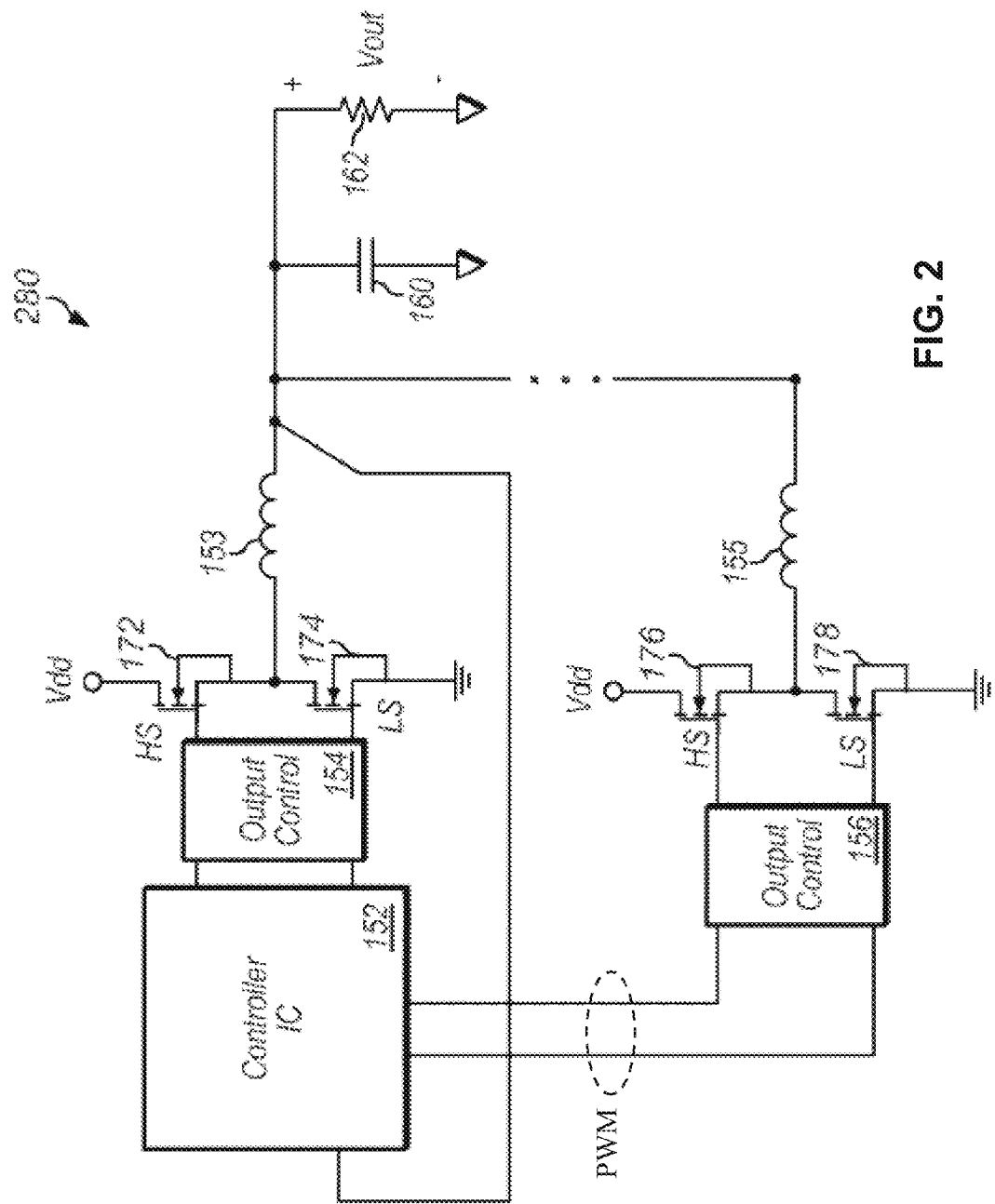
FIG. 2 is a block diagram illustrating an example implementation of a controller such as that shown in FIG. 1.

One example of a current sharing configuration is shown in FIG. 2. As shown in FIG. 2, multiphase regulator 280 contains multiple output stages (two stages 154 and 156 are shown in this example) with FET-pairs (172/174 and 176/178) and inductors (153 and 155). Output stages 154, 156 provide a single output voltage $V_{OUT}$ (at capacitor 160, to exemplary load 162 for example), and a single controller (for example, a controller IC 152) may be used with a single input for voltage feedback $V_{FB}$, a single compensator (i.e. PID) and multiple PWM outputs. The multiple PWM outputs may be provided to respective output stages (i.e. drive circuits) 154 and 156. In some embodiments, the output stages may be commonly implemented by a single circuit or IC, or the output stages may also be included in controller IC 152. The inter-phase communication bus in multiphase regulator 280 may be contained within the controller 152, allowing high-bandwidth current sharing in a digital controller. While only two output stages are shown in the embodiment of FIG. 2, various embodiments may include more output stages arranged in a manner similar to those shown. Those skilled in the art will appreciate that various illustrations of the converters (or voltage regulators) and voltage regulator systems disclosed herein are meant to embody all possible implementations in accordance with the principles set forth herein.

In many regulators, information about the current (i.e. the inductor current, e.g. the current in inductor 142 in voltage supply/regulator 100) is integral to servicing many of the functions in a PWM controller (such as PWM controller 134 in FIG. 1). These functions include voltage accuracy, transient response, current balance, circuit fault protection, and telemetry. Obtaining high-quality inductor current information to support these functions can be among the more challenging requirements of a controller IC design. Quality may be quantified in terms of accuracy, precision, bandwidth and latency. High quality comes from high accuracy, high precision, high bandwidth and/or low latency.

Synthesizing inductor current from known system parameters can mitigate much of the challenge of obtaining current information over current measurement alone. This is due to the fact that the dynamic component of current in an inductor (i.e., how the current changes with respect to time) may be calculated from system parameters that can be far less challenging to obtain with high precision than it would be to obtain the value of the current itself. The first order system parameters include the voltage across the inductor and the inductance value, [di/dt=V/L]. A more accurate calculation may include inductor and/or switch losses. And a still more sophisticated calculation may include non-linearities or parameter drift over time. All of these characteristics may be either estimated or measured with relatively low cost in circuit area and power consumption. More sophisticated calculations improve the quality of synthesized information, but come at the expense of computation circuit area and power consumption. Higher quality synthetic (or calculated) information can lower the cost of the measurement circuitry needed to provide the missing steady-state inductor current component. In a system where the synthesizer is designed in digital logic, and steady-state inductor current is measured using a mostly analog circuit, the overall cost and power optimization is benefitted by scaling applied according to Moore's Law. This approach to obtaining output current information may be very attractive for digital power controllers. Nevertheless, even in controllers including current synthesizers as described above, accurate inductor current measurements are still needed for synthesizer current correction and other functions.

Figure 3:
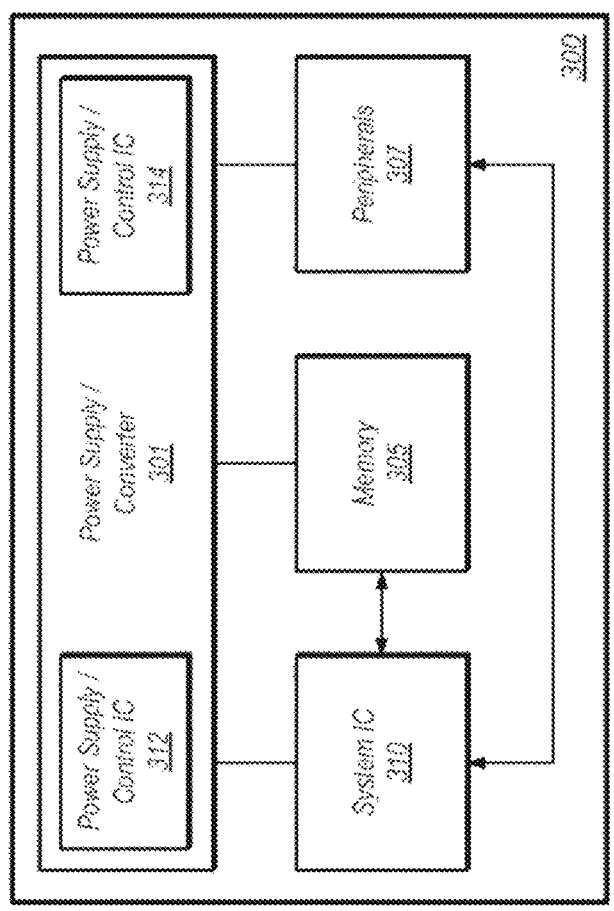
FIG. 3 is a block diagram illustrating an example system having a power supply including a controller such as that shown in FIG. 1.

Overall, various embodiments of regulators disclosed herein may include power supply (or power converter or voltage regulator) control circuitry designed to help optimize operation of switching regulators/supplies, including accurate current synthesis that is improved using accurate current measurements. FIG. 3 shows a block diagram of one embodiment of a system 300 that includes a power supply 301 designed according to the principles described herein, and which will be further detailed below. The system 300 includes at least one instance of a power supply/regulator 301 providing one or more supply voltages to the system integrated circuit (or processing element) 310, one or more peripherals 307 and memory subsystem (or memory) 305. Memory 305 may include, for example, programming instructions that may be executable by processing element 310 to perform various system functions, which may also include controlling and/or operating peripherals 307.

In some embodiments, more than one instance of power supply/converter 301 may be included. Furthermore, regulator 301 may include one or more power supply control integrated circuits, such as power supply control ICs 312 and 314. Power supply control ICs 312 and 314 may include various components such as feedback control circuitry, PWM modulation circuitry, output stage control circuitry and the like. Furthermore, in some embodiments the control circuitry may not be included on a separate IC or ICs and may simply be a part of power supply 301. Overall, various embodiments of power supply 301 may be divided into two major components, the driving stage that includes high-side and low-side FETS, and the control circuitry encompassing elements performing control of the drive signals driving the FETs in the output stage. As shown in FIG. 3, the control circuitry is embodied in the form of an IC that may couple to either a driving stage (such as output control stage 136 shown in FIG. 1), or it may couple directly to high-side FET(s) and low-side FET(s) such as FETs 138 and 140 in FIG. 1. In some embodiments system 300 may itself be a system on a chip (SOC) whereby system 300 is an IC, with all components, including those of power supply 301 and power supply control ICs 312 and/or 314 a part of the same IC.

The peripherals 307 may include any desired circuitry, depending on the type of system. For example, in one embodiment, the system 300 may be included in a mobile device (e.g., personal digital assistant (PDA), smart phone, etc.) and the peripherals 307 may include devices for various types of wireless communication, such as Wi-Fi, Bluetooth, cellular, global positioning system, etc. The peripherals 307 may also include additional storage, including RAM storage, solid-state storage, or disk storage. The peripherals 307 may include user interface devices such as a display screen, including touch display screens or multi-touch display screens, keyboard or other input devices, microphones, speakers, etc. In other embodiments, the system 300 may be included in any type of computing system (e.g. desktop personal computer, laptop, workstation, net top etc.). Furthermore, the system memory 305 may include any type of memory.

Figure 4:
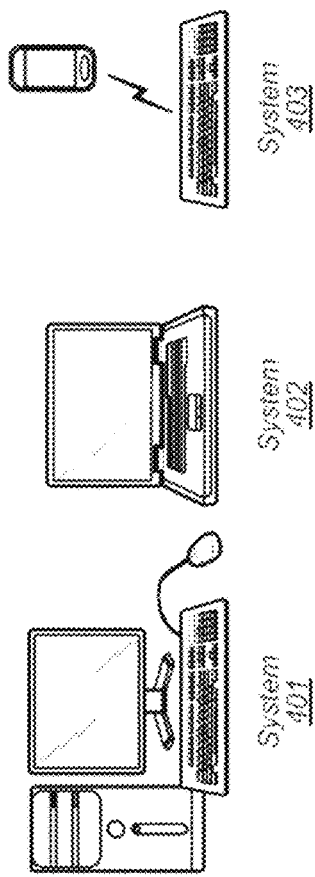
FIG. 4 illustrates example computing systems incorporating a power supply such as that shown in FIG. 3.

Several embodiments of computing systems that may include all or part of system 300, and more specifically power supply 301 and/or Power supply control ICs 312 and/or 314 are illustrated in FIG. 4. System 401 may represent a desktop computer, system 402 may represent a laptop computer, and system 403 may represent a tablet or smartphone with a wireless keyboard. System 401 may include one or more human interface devices (HIDs), such as a keyboard, a mouse, a microphone, a camera, etc. Systems 402 and system 403 may include similar HIDs to system 401. Other devices not illustrated, such as smart televisions or video game consoles may also include various forms or embodiments of a power supply or power supply controller such as those disclosed herein. It is noted that the computer systems illustrated in FIG. 4 are merely provided as examples. Other types of systems with power supplies/regulators and Power supply control ICs are possible and contemplated.

Figure 5:
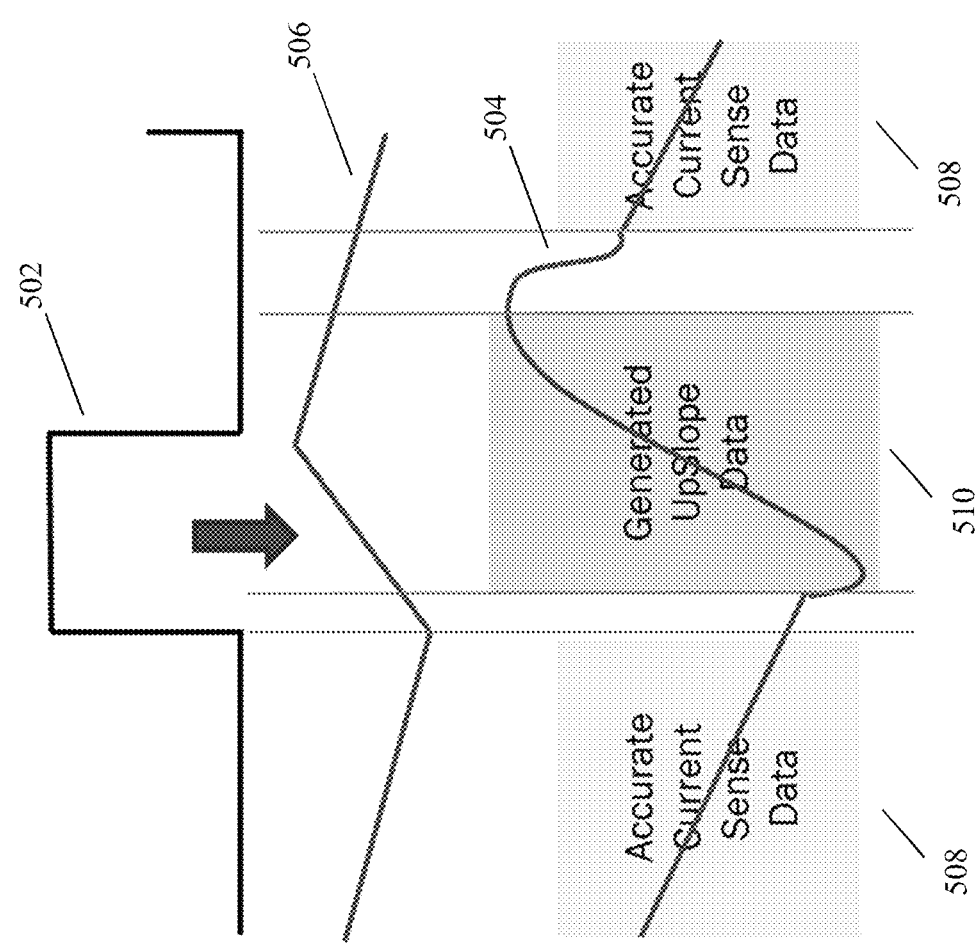
FIG. 5 provides waveform diagrams illustrating aspects of sampling inductor currents in a controller.

Among other things, and as mentioned above, the present applicants recognize that sensing inductor current (e.g. the currents in inductors 153, 155 in FIG. 2) accurately through the entire PWM switching period can be difficult and expensive. For example, conventional solutions tend to provide an accurate representation of inductor current during only small windows of time within the PWM period, leaving the remaining times within the period noisy or inaccurate. More particularly, as shown in FIG. 5, waveform 502 represents the PWM modulator (e.g. 134 in FIG. 1) output for a given phase (i.e. one phase in a multi-phase controller). Meanwhile, waveform 504 represents the corresponding inductor current in the phase. As shown in FIG. 5, accurate current sense data can only be obtained in intervals 508 of the current waveform 504, which intervals 508 correspond to when the PWM modulator output 502 is in a low state (i.e. the high side FET 138 is turned off and the low side FET 140 is turned on). However, during intervals 510 of current waveform 504, when the inductor current is increasing in response to the high state of the PWM modulator output 502, current sense data can be very unreliable and inaccurate.

The present applicants recognize that digital systems could possibly be made more accurate by only utilizing samples that are acquired during the accurate portions of the signal from the current sensor (e.g. intervals 508 in FIG. 5), and the more samples that can be acquired during these times, the better. Viewed in the context of a single phase, an optimal distribution of samples would be to burst all samples during the accurate portion of the inductor current signal and pause until the next accurate window. However, an ADC supporting such a scheme would waste the power and area dedicated to this phase in proportion to the fractional window over which it sampled within the PWM period. But viewed in the context of a multiphase system, the present applicants envision a more optimal use of this same ADC by time-sharing its samples across multiple phases whose accurate time windows are exclusive in time.

Figure 6:
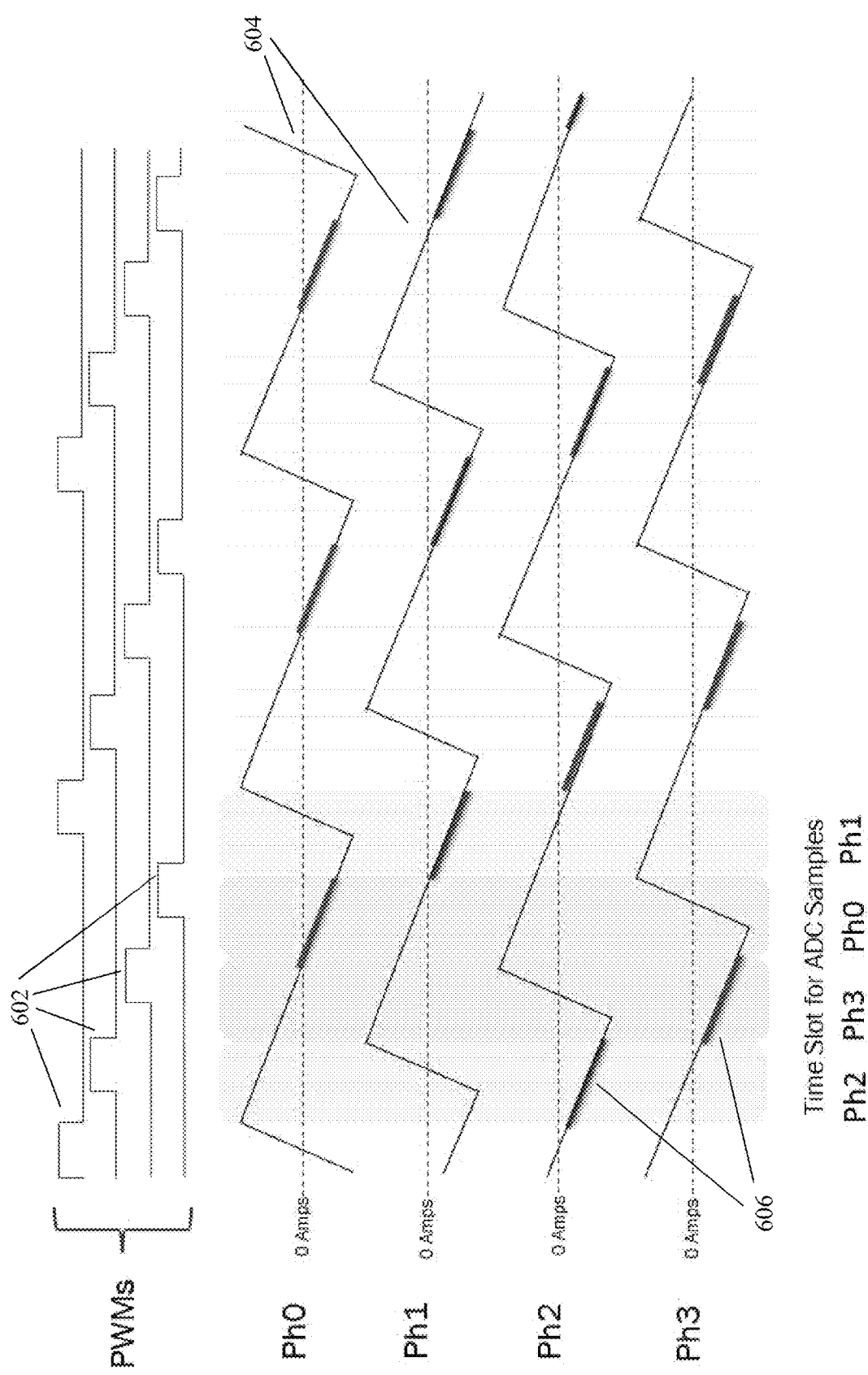
FIG. 6 provides waveform diagrams illustrating aspects of a shared inductor current sampling technique according to embodiments.

For example, the present applicants recognize that, in a steady state of a multiphase controller, the PWM periods are fixed and phase relationships between phases are evenly distributed, making optimal time sharing of samples as straight forward as to have it follow the phase interleaving pattern. More particularly, as shown in FIG. 6, waveforms 602 represent the PWM modulator (e.g. 134 in FIG. 1) outputs for each of four phases in a four-phase controller. In this example, the PWM periods are all the same and the "high" state portions of the PWM waveforms 602 are evenly distributed between the phases. Waveforms 604 represent the inductor currents in each of the phases that are generated in response to the PWM waveforms 602. Due to the very even distribution of the "high" state portions of the PWM waveforms 602, the accurate portions 606 of the current waveforms 604 (e.g., as described above in FIG. 5) are also very evenly distributed. As such, a simple TDM approach using a single shared ADC can be used to sequentially measure the current waveforms 604 for each of the phases one at a time.

Although the example of FIG. 6 makes time sharing of samples fairly straight forward, in practice PWM periods and phase relationships can change dramatically with changes in the load on the voltage regulator. This is especially true if modulation schemes employing dual edge modulation, dynamic switching frequency or other techniques that make PWM edges aperiodic. Optimal time sharing under dynamic loading requires that the time sharing follow the modulation of all of the PWM phases over which the ADC is shared.

Optimal time sharing may be further complicated in systems that employ prediction in the current information used in the modulator. Returning to FIG. 5, and as described above, such systems may synthesize inductor current information (e.g. the waveform 506 in FIG. 5) from the known PWM signals (e.g. the waveform 502 in FIG. 5) along with relatively low bandwidth measurement of other parameters affecting inductor current such as input and output voltages, PWM propagation delays and the inductance value. As such systems are predictive, they have the potential to diverge from actual inductor current. This is particularly true under dynamic loading when system parameters are more dynamic. Divergence may be contained by supplying the synthesizer with accurate measured inductor current at a sufficient rate and at such critical times when the synthesizer may likely be in error. As such, the optimal sharing of ADC samples of actual inductor current among phases may be, in some part, determined by the synthesizer architecture and system component characteristics.

According to certain aspects, some embodiments to be described in more detail below use data from the PWM modulator (e.g. in controller 152 in FIG. 2) along with weights based on the PWM waveform and past conversions in order to prioritize which current sense input should be sampled for each conversion. As set forth above, the PWM modulator creates the PWM signal to be sent to the external output stage (e.g. 154 and 156 in FIG. 2) or FET's. The PWM signal received by the output stage then gets level shifted and applied to the power FET's (e.g. 172-178 in FIG. 2) used to drive the power inductors (e.g. 153 and 155 in FIG. 2). The resulting current sensed across the low FET devices is then driven onto a pin of the output stage (e.g. 154 and 156 in FIG. 2) which is connected back to the controller (e.g. controller 152 in FIG. 2) to be sensed. The total time from PWM generation to the resulting analog sense tends to be a couple of system clock cycles (e.g. 80 ns or so). As shown in FIG. 5 and as described above, most output stages only generate useful data while the low FET is on since current is sensed across the low FET. Therefore, a preferred portion of the PWM signal to measure is from approximately 300 ns after the PWM goes low until the PWM goes high. Also, in a typical multiphase modulator, the phases are sequenced throughout the switch period in order to minimize the ripple, which ensures that generally not all phases have valuable data simultaneously.

By programming the device with weighted states based on the PWM modulator and collecting data based on past samples, the approach according to the present embodiments creates a queuing system which maximizes the useful data samples from multiple phases into a shared ADC. The queueing system determines which phase should be sampled next, ensuring that all phases have received valid data recently, and choosing the next phase to sample based on the state of the modulator (i.e., where in the analog waveform the ADC will be sampling). This queuing system can also be used to determine the best time for the ADC to take auto-zero samples to minimize ADC offset. Because the resulting sampling is non-periodic, the present embodiments also track the sample frequency for each phase in order to account for the varying input impedance on each phase. In addition, each phase can be programmed with a minimum sampling period which can be set to ensure a maximum sampling frequency for each phase.

Figure 7:
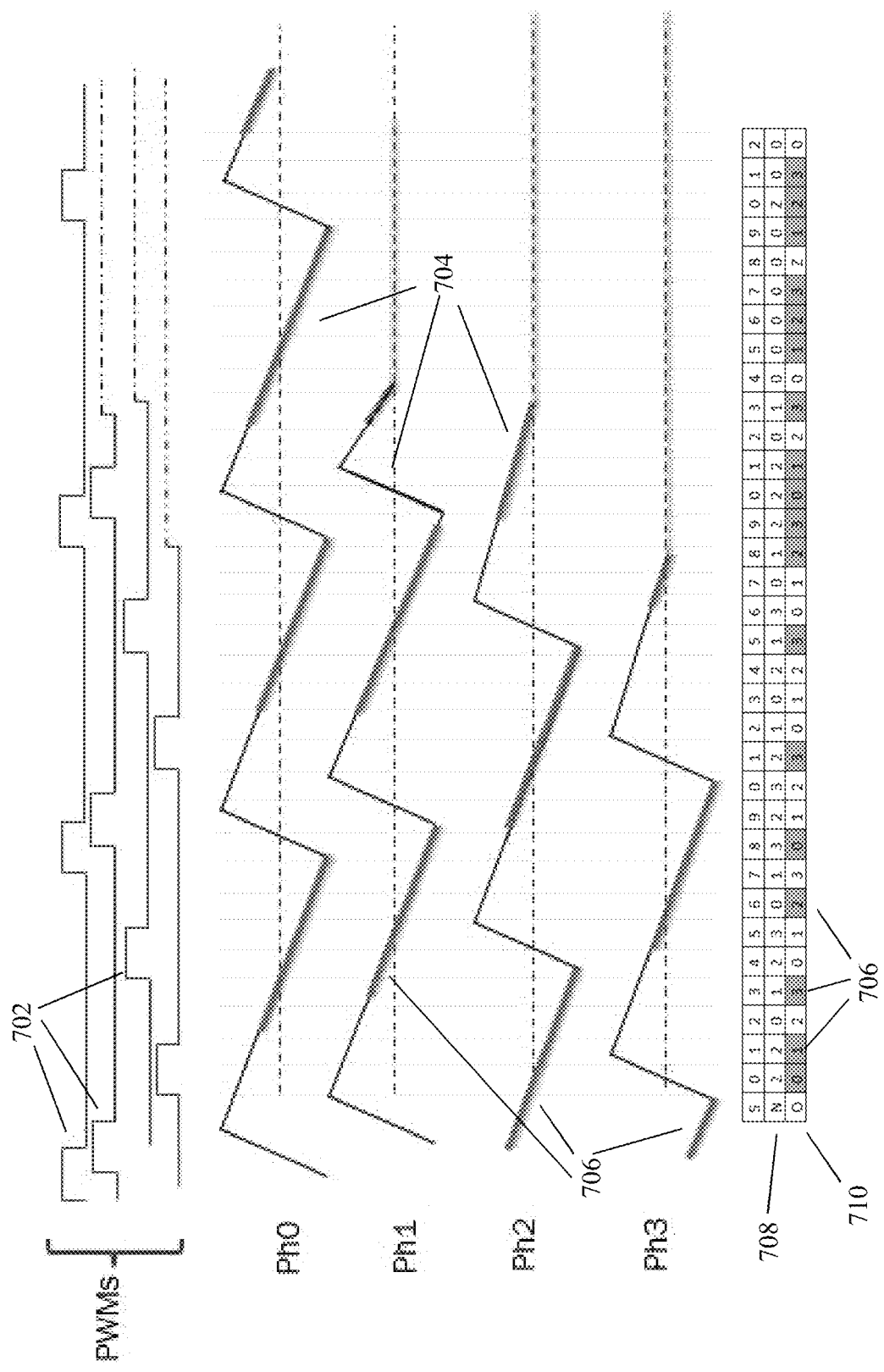
FIG. 7 provides waveform diagrams illustrating aspects of an example prioritized inductor current sampling technique according to embodiments.

FIG. 7 is a timing diagram illustrating example aspects of predictive sample queueing according to embodiments. As shown, PWM waveforms 702 are generated by a controller for each phase of a 4-phase converter. In this example, due to load requirements, waveforms 702 are not equally spaced and interleaved between phases as in the example of FIG. 5. Waveforms 704 represent the respective inductor currents in the four phases that are generated in response to PWM waveforms 702, with each waveform 704 having accurate portions 706 as described above. Also in this example, the load is decreasing so phases are being incrementally dropped, starting with Ph3 being dropped, then Ph2 being dropped, and then Ph1 being dropped, whereupon on Ph0 is being operated.

The table below the waveforms indicates from which phase inductor current samples are taken in each sampling period. As can be seen, in contrast to a simple TDM technique (i.e. samples in row 710), the inductor current samples are taken from phases having the most accurate current information (i.e. using the present embodiments, row 708) during the given sample period. For example, in periods 0 and 1, the current is sampled from Ph2 (rather than 0 and 1 in the TDM approach), in period 2 the current is sampled from Ph0, in period 3 the current is sampled from Ph1, and so on. As further shown in the Table, the present approach reduces the number of inaccurate samples 712 that are obtained using a simple TDM approach. The prioritization of how the phases are allocated for sampling in a given sample period will be described in more detail below.

Figure 8:
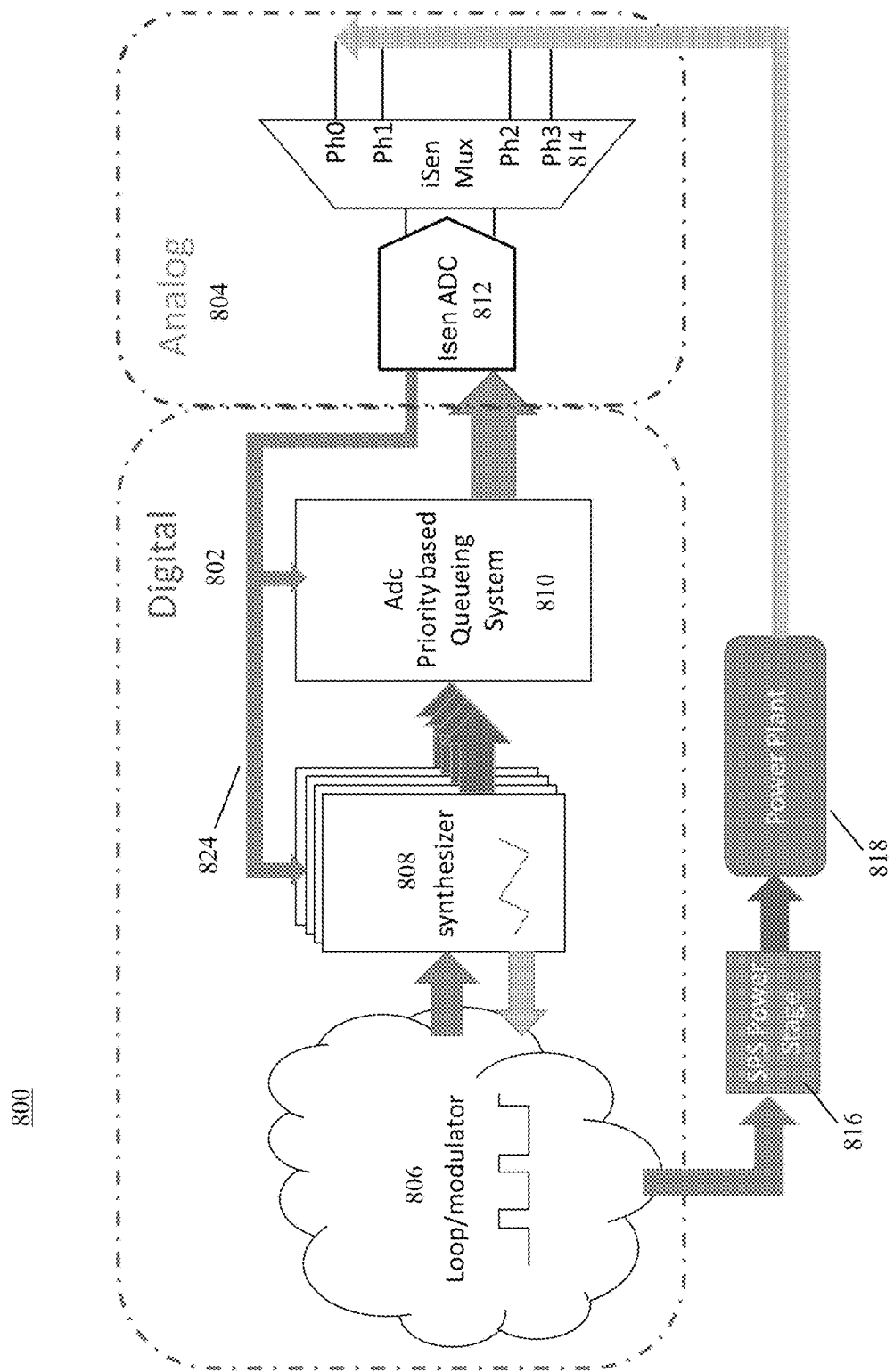
FIG. 8 is a block diagram illustrating an example controller in which the present embodiments can be implemented.

FIG. 8 is a block diagram illustrating an example implementation of a predictive sampling scheme in a converter according to embodiments.

As shown in this example, a controller 800 (e.g. an example implementation of 152 in FIG. 2) includes a digital portion 802 and an analog portion 804. The digital portion 802 includes a loop/modulator 806, a current synthesizer 808 and a sample queueing system 810.

The analog portion 804 includes a current sense analog-to-digital converter (Isen ADC) 812 and a multiplexer 814. Based on signals from queueing system 810, Isen ADC 812 obtains analog samples from phases Ph1 to Ph4 via multiplexer 814. The samples are digitized and provided to synthesizer 808 and queueing system 810. An aspect of the present embodiments is that only a single ADC 812 is needed for sampling inductor currents from all phases Ph1 to Ph4, as controlled by sample queueing system 810.

Current samples from ADC 812 can be used for current synthesizer correction, for example as described in U.S. Pat. No. 9,419,627, the contents of which are incorporated by reference herein in their entirety. In turn, synthesizer 808 provides corrected current synthesizer data to loop/modulator 806, e.g. using a combination of predicted data and measurement data as described in co-pending Application No. 16/357,212, the contents of which are incorporated by reference herein in their entirety). Loop/modulator 806 uses the generated current data from synthesizer 808, along with other information, to generate the appropriate PWM modulated signals to output stages 816, which use the signals to drive current to power plant 818.

Figure 9:
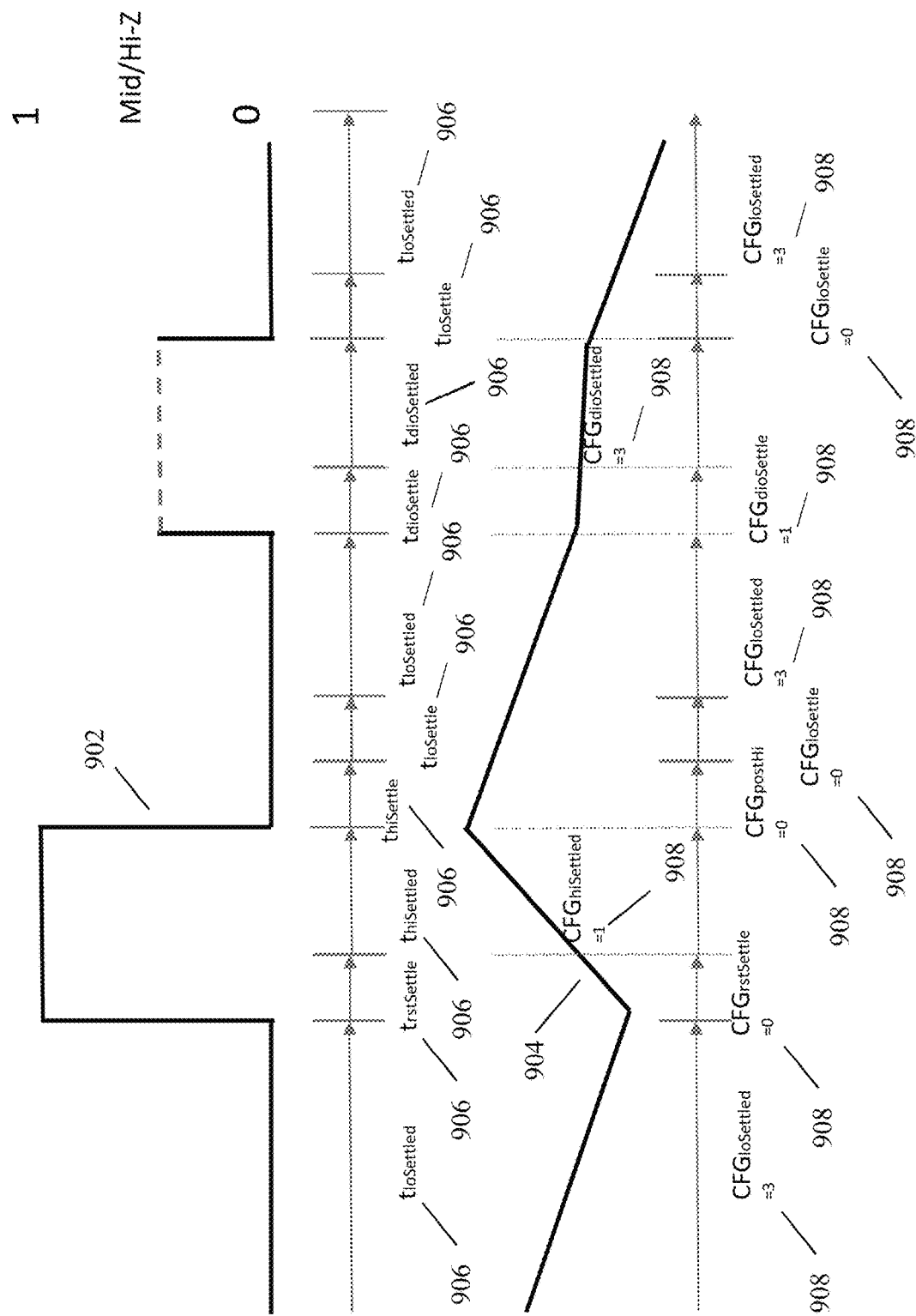
FIG. 9 are timing diagrams illustrating an example of how a prioritized inductor current sampling technique according to embodiments can be implemented.

FIG. 9 are timing diagrams illustrating aspects of an example methodology for implementing sample queueing system 810 according to embodiments.

As shown in FIG. 9, waveform 902 represents a PWM modulator output for a given phase, and waveform 904 represents a corresponding inductor current for the given phase that is generated in response to the waveform 902. As further shown, the present embodiments identify three primary states: a low state in which the switched terminal of the inductor is actively pulled to a low voltage through a low-side switch or FET (e.g. 140 in FIG. 1), a high state in which the switched terminal of the inductor is actively pulled to a high voltage through a high-side switch or FET (e.g. 138 in FIG. 1), and a Mid/Hi-Z state (i.e. dio) in which both switches or FETs are in a non-conducting state. In the final state the inductor current will forward-bias the body diode of one of the two FET's, the FET in question determined/selected according to the polarity of the inductor current.

FIG. 9 also depicts transitional states 906 between each primary PWM state according to embodiments. These transitional states describe time segments for which the system is in a process of settling from an event. For each PWM event (rising edge, falling edge, mid-Drive/Hi-Z state) a period of time (or length of time) may be specified for each designated slot. The designated slots may be grouped into two major categories, namely a 'settle' slot, and a 'settled' slot. Therefore, as illustrated in FIG. 9, there may be a different "settle" and "settled" slot for each PWM event.

As further shown in FIG. 9, a respective weight 908 may be specified (i.e. configured) for each respective time slot 906. The respective weight 908 values are used by queueing system 810 to determine how to prioritize ADC sampling between phases for any given sampling period. In this example, there are three possible weight values, with 0 representing no current sample accuracy, 1 representing very little current sample accuracy, and 3 representing high current sample accuracy. This facilitates the sampling of each accurate section of the corresponding current sense waveform, while limiting or zeroing the current sampling in sections of the waveform where the actual current sense waveform may be either very noisy, or simply invalid. For example, while samples may be obtained on the up-slope in the $CFG_{hiSettled}$ time slot, the low weight value indicates that the sampled current in that section will not likely be accurate. On the other hand, samples obtained on the down-slope in the $CFG_{loSettled}$ time slot will likely be very accurate as indicated by the relatively high weight value.

In operation, therefore, in each sample period, queueing system 810 receives modulator waveform 902 information for each phase and determines which time slot 906 the phase is currently in. Based on the time slot 906, queueing system 810 further determines the weight value 908 to apply to each phase. In one example, the phase having the highest weight in a given sample period will be selected for sampling by ADC 812 by generating the appropriate control signal to mux 814. In these and other embodiments, queueing system 810 can include a memory or store that contains configuration of the specified "slots" of the PWM waveforms as well as the weights assigned to them, and can access this memory or store to use in determining the phase with the highest weight for a given sampling period.

Referring back to FIG. 7, it can be seen that as compared to a simple TDM approach, in which the samples for each phase are obtained at a fixed sampling frequency, the effective sampling frequency for each phase in the present embodiments is not fixed. This may cause the ADC input impedance, and thus the gain, for each phase to vary from sample to sample. As such, in some embodiments, the actual sampling frequency for each phase is tracked and used to adjust the ADC gain as needed. Additionally and relatedly, queueing system 810 can include a fixed maximum delay between samples for a given phase, and can use this in addition to or alternatively to the calculated weights for determining which phase to sample for a given sample period. In other words, if a given phase has not been sampled after a maximum delay since it was last sampled, it will be selected for sampling in the current sample period, even if its weight is not the highest across all phases. In other embodiments, rather than, or in addition to having a fixed maximum sampling delay, the period between samples for each phase can be a programmable parameter.

Figure 10:
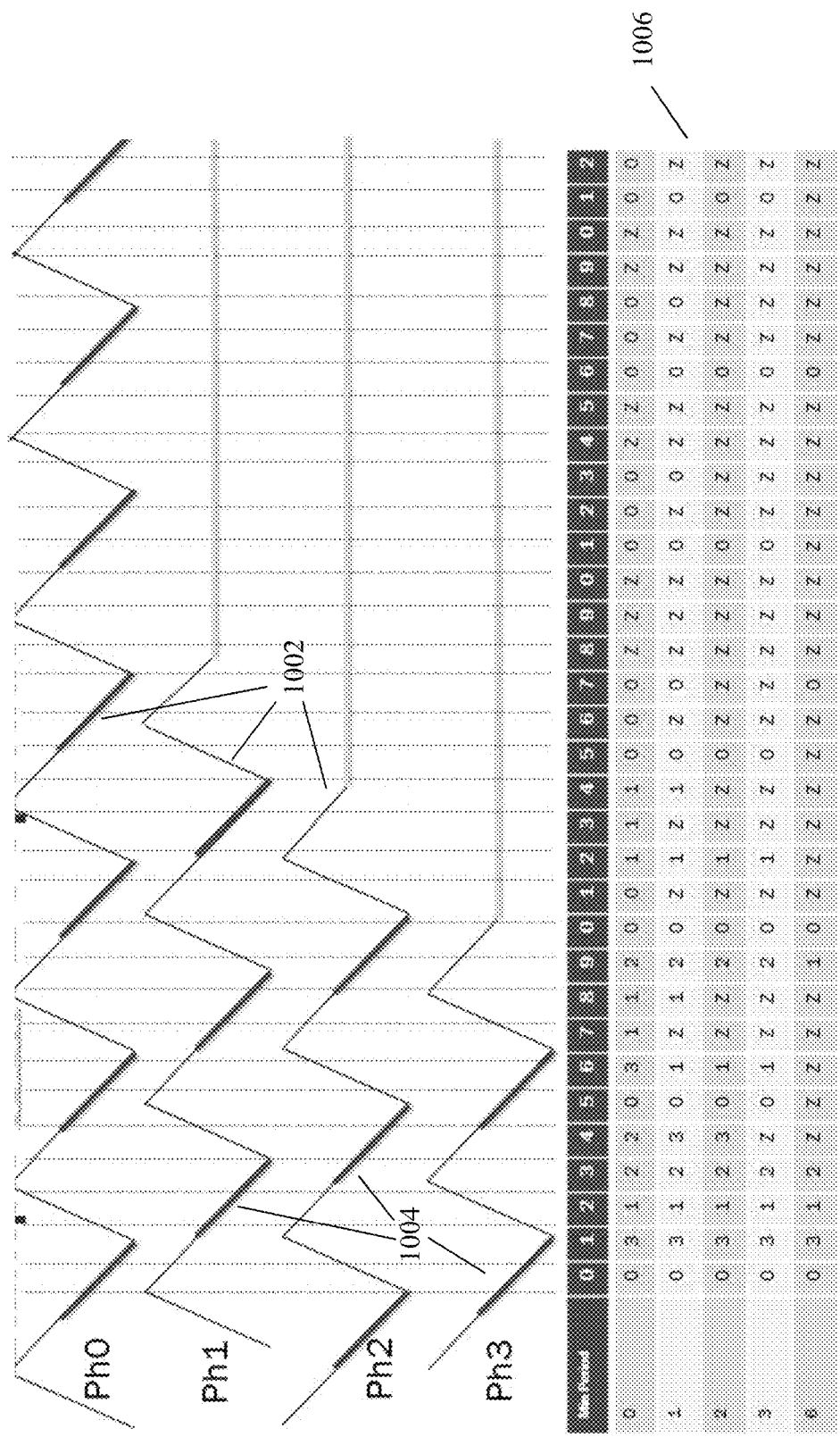
FIG. 10 provides waveform diagrams illustrating aspects of another example prioritized inductor current sampling technique according to embodiments.

In this regard, FIG. 10 is a timing diagram illustrating additional or alternative aspects of a prioritized sampling scheme including a programmable minimum period according to embodiments.

In this example waveforms 1002 represent inductor currents in a controller for each phase of a 4-phase converter. In this example, similar to the waveforms shown in FIG. 7, due to load requirements, waveforms 1002 and their respective accurate portions 1004 are not equally spaced and interleaved between phases as in the example of FIG. 5. Further similar to FIG. 7, in this example, the controller load is decreasing so phases are being incrementally dropped, starting with Ph3, then Ph2, and then Ph1.

The table 1006 indicates from which phase inductor current samples are taken in each sampling period. Differently from the implementation of FIG. 7, phases are selected for sampling further based on a minimum sampling period between samples in addition to the availability of accurate current samples, as specified by the weights described above in connection with FIG. 9. For example, as shown in FIG. 9, when the "minimum period" parameter is 0, queueing system 810 selects phase 2 for sampling in both periods 3 and 4. However, if the "minimum period" parameter is 1, queueing system 810 selects phase 2 for sampling in period 3 but does not select phase 2 in the immediate next period 4, and instead selects phase 3.

Figure 11:
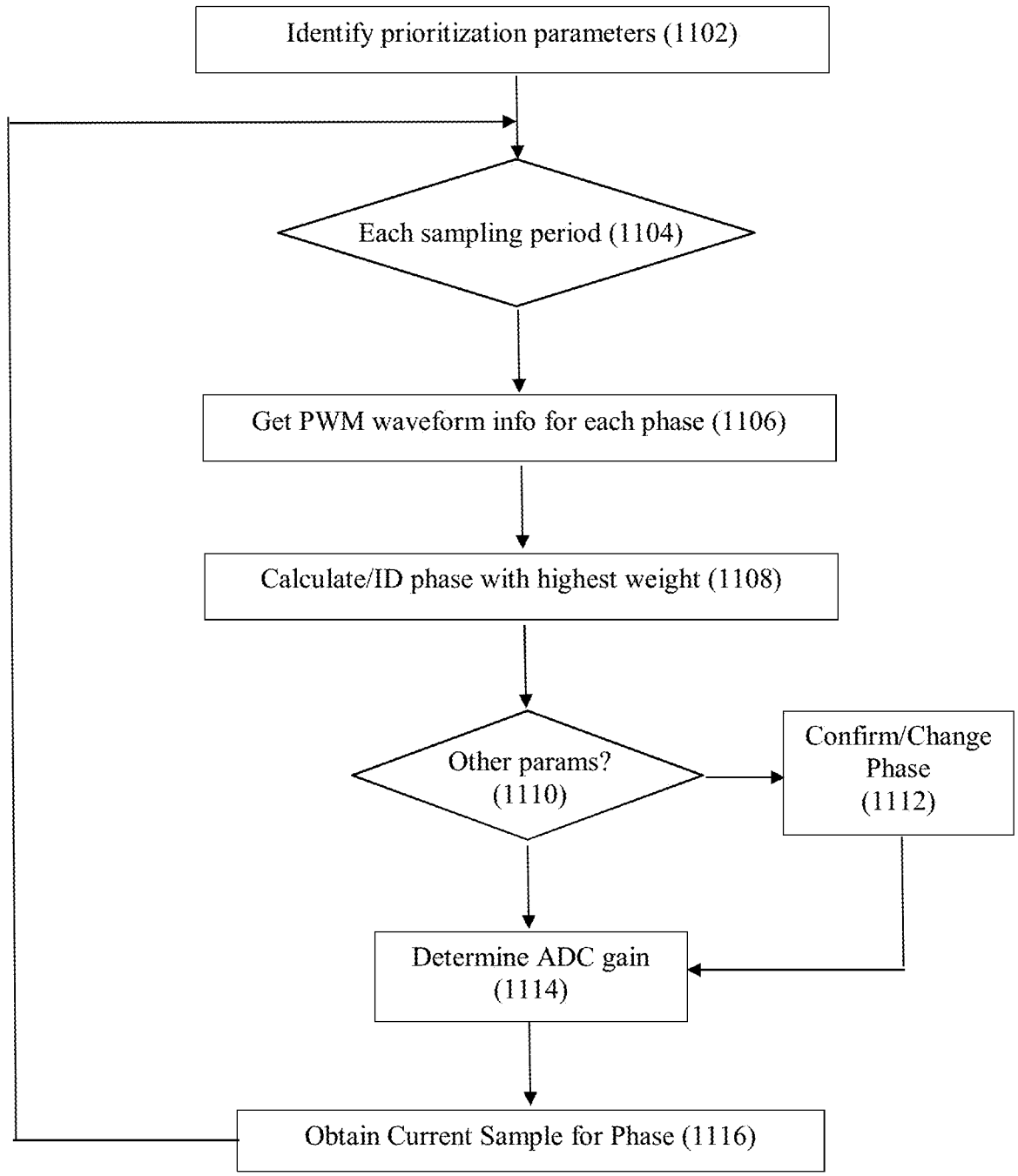
FIG. 11 is a flowchart illustrating an example methodology according to the present embodiments.

FIG. 11 is a flowchart illustrating an example prioritized current sampling methodology according to embodiments.

In block 1102, the queueing system (e.g. 810) identifies the prioritization parameters to use for current sampling among phases, such as the configuration of slots in the PWM waveform, as well as associated weights. As set forth above, the parameters may further include a maximum delay between samples, a minimum sampling period, etc. In block 1104, processing then proceeds sample by sample for each sampling period of a single ADC (e.g. ADC 812). For example, in block 1106, the queueing system 810 receives the PWM waveform information for each phase at the given instant (e.g. from loop/modulator 806). Using the PWM waveform information and the prioritization parameters (e.g., as described in connection with FIG. 9), queueing system 810 determines the phase that currently has the highest weight in block 1108. In some embodiments, the highest weight is the only determination that needs to be made. However, in block 1110, it is determined whether other criteria should be used as well. If so, in block 1112, other prioritization parameters are used to determine whether a different phase other than the one with the highest weight should be selected for sampling. As set forth above, these other parameters can include a maximum delay between samples, a minimum sampling period, etc. Based on these other prioritization parameters, the phase with the highest weight is either confirmed or replaced with a different phase. In either event after block 1110, in block 1114 the actual sampling period for the selected phase is determined and used to adjust the ADC gain, if necessary. The ADC (e.g. 812) is then caused to obtain an inductor current sample from the selected phase (e.g. by sending the appropriate control signal to mux 814). As set forth above, the inductor current sample (along with the identification of the sampled phase) can then be provided to other circuitry such as a current synthesizer (e.g. 808) and/or a loop/modulator (e.g. 806).

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus for sampling inductor currents in a multiphase controller, comprising:
   an analog-to-digital converter configured to sample any one of a plurality of different analog signals respectively corresponding to a plurality of phases of the multiphase controller;
   a multiplexer that selectively causes the analog-to-digital converter to sample one of the plurality of analog signals based on a control signal; and
   a queueing system that generates the control signal at each one of a plurality of sampling periods based on pulse width modulation (PWM) waveform information associated with the plurality of phases for the each sampling period.

2. The apparatus of claim 1, further including configuration information that the queueing system uses to generate the control signal so as to prioritize the one of the plurality of analog signals for the each sampling period.

3. The apparatus of claim 2, wherein the configuration information includes designations of a plurality of time slots in the PWM waveform and a corresponding plurality of weights for the plurality of time slots, the queueing system using the plurality of weights and the PWM waveform information to prioritize the one of the plurality of analog signals for the each sampling period.

4. The apparatus of claim 3, wherein the plurality of weights identify certain ones of the plurality of time slots in the PWM waveform during which current sense information for an associated phase is accurate.

5. The apparatus of claim 1, wherein each of the plurality of analog signals comprises an inductor current sense signal.

6. An apparatus for sampling inductor currents in a multiphase controller, comprising:
   an analog-to-digital converter configured to sample any one of a plurality of different analog signals respectively corresponding to a plurality of phases of the multiphase controller;
   a multiplexer that selectively causes the analog-to-digital converter to sample one of the plurality of analog signals based on a control signal; and
   a queueing system that generates the control signal at each one of a plurality of sampling periods based on pulse width modulation (PWM) waveform information associated with the plurality of phases for the each sampling period, and a minimum sampling period designated for the plurality of phases.

7. The apparatus of claim 6, further including configuration information that the queueing system uses to generate the control signal so as to prioritize the one of the plurality of analog signals for the each sampling period.

8. The apparatus of claim 7, wherein the configuration information includes designations of a plurality of time slots in the PWM waveform and a corresponding plurality of weights for the plurality of time slots, the queueing system using the plurality of weights and the PWM waveform information to prioritize the one of the plurality of analog signals for the each sampling period.

9. The apparatus of claim 8, wherein the plurality of weights identify certain ones of the plurality of time slots in the PWM waveform during which current sense information for an associated phase is accurate.

10. The apparatus of claim 6, wherein each of the plurality of analog signals comprises an inductor current sense signal.

11. A method for sampling inductor currents in a multiphase controller, comprising:
    configuring an analog-to-digital converter to sample any one of a plurality of different analog signals respectively corresponding to a plurality of phases of the multiphase controller;
    selectively causing the analog-to-digital converter to sample one of the plurality of analog signals based on a control signal; and
    generating the control signal at each one of a plurality of sampling periods based on pulse width modulation (PWM) waveform information associated with the plurality of phases for the each sampling period.

12. The method of claim 11, wherein generating the control signal further includes prioritizing the one of the plurality of analog signals for the each sampling period based on configuration information.

13. The method of claim 12, wherein the configuration information includes designations of a plurality of time slots in the PWM waveform and a corresponding plurality of weights for the plurality of time slots, wherein generating the control signal includes using the plurality of weights and the PWM waveform information to prioritize the one of the plurality of analog signals for the each sampling period.

14. The method of claim 13, wherein the plurality of weights identify certain ones of the plurality of time slots in the PWM waveform during which current sense information for an associated phase is accurate.

15. The method of claim 11, wherein each of the plurality of analog signals comprises an inductor current sense signal.

\* \* \* \* \*